United States Patent [19]
Yamazaki et al.

[11] Patent Number: 5,789,284
[45] Date of Patent: Aug. 4, 1998

[54] METHOD FOR FABRICATING SEMICONDUCTOR THIN FILM

[75] Inventors: Shunpei Yamazaki, Tokyo; Hisashi Ohtani, Kanagawa; Akiharu Miyanaga, Kanagawa; Satoshi Teramoto, Kanagawa, all of Japan

[73] Assignee: Semiconductor Energy Laboratory Co., Ltd., Japan

[21] Appl. No.: 536,977

[22] Filed: Sep. 29, 1995

[30] Foreign Application Priority Data

Sep. 29, 1994 [JP] Japan .................................. 6-259117

[51] Int. Cl.$^6$ .......................... H01L 21/00; H01L 21/326; H01L 21/84
[52] U.S. Cl. .......................... 438/166; 438/402; 438/476
[58] Field of Search .......................... 437/12, 40 TFT, 437/41 TFT, 21; 148/DIG. 16, DIG. 60, DIG. 61; 438/476, 402, 166

[56] References Cited

U.S. PATENT DOCUMENTS

| | | | |
|---|---|---|---|
| 4,561,171 | 12/1985 | Schlosser | 437/10 |
| 5,147,826 | 9/1992 | Liu et al. | 437/233 |
| 5,229,306 | 7/1993 | Lindberg | 437/12 |
| 5,244,819 | 9/1993 | Yue | 437/11 |
| 5,275,851 | 1/1994 | Fonash et al. | 427/578 |
| 5,441,899 | 8/1995 | Nakai | 438/766 |
| 5,444,001 | 8/1995 | Tokuyama | 437/10 |
| 5,529,937 | 6/1996 | Zhang | 437/10 |

FOREIGN PATENT DOCUMENTS

| | | |
|---|---|---|
| 3-229415 | 10/1991 | Japan . |
| 6-333824 | 12/1994 | Japan . |

OTHER PUBLICATIONS

C. Hayzelden et al., "*In Situ* Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by Low–temperature rapid thermal annealing of amorphous silicon," *J. Appl. Phys.*, 65(5), Mar. 1, 1989, pp. 2096–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by Low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids*, 115, 1989, pp. 66–68.

*Primary Examiner*—John Niebling
*Assistant Examiner*—Michael S. Lebentritt
*Attorney, Agent, or Firm*—Sixbey, Friedman, Leedom & Ferguson; Gerald J. Ferguson, Jr.; Jeffrey L. Costellia

[57] ABSTRACT

An object of the present invention is to provide a technology of reducing a nickel element in the silicon film which is crystallized by using nickel. An extremely small amount of nickel is introduced into an amorphous silicon film which is formed on the glass substrate. Then this amorphous silicon film is crystallized by heating. At this time, the nickel element remains in the crystallized silicon film. Then an amorphous silicon film is formed on the surface of the silicon film crystallized with the action of nickel. Then the amorphous silicon film is further heat treated. By carrying out this heat treatment, the nickel element is dispersed from the crystallized silicon film into the amorphous silicon film with the result that the nickel density in the crystallized silicon film is lowered.

64 Claims, 9 Drawing Sheets

IMPURITY ION IMPLANTATION AND LASER LIGHT IRRADIATION

IMPURITY ION IMPLANTATION AND LASER LIGHT IRRADIATION

HEAT TREATMENT

LASER LIGHT IRRADIATION

FIG.9C

METHOD FOR FABRICATING SEMICONDUCTOR THIN FILM

BACKGROUND OF THE INVENTION

1. Field of the Invention

The present invention relates to a method for forming a silicon semiconductor thin film which has a crystallinity and is formed on a substrate having an insulation surface of a glass substrate or the like.

2. Description of the Related Art

In recent years, attention has been directed to technology for constructing a thin film transistor by using a silicon thin film which is formed on a glass substrate. This thin-film transistor is primarily used in an active matrix type liquid crystal electro-optical device and other thin film integrated circuits. The liquid crystal electro-optical device changes optical characteristics of a liquid crystal thereby displaying an image by charging a liquid crystal into a pair of glass substrates and applying an electric field.

In particular, the active matrix type liquid crystal display device using a thin film transistor is characterized in that the thin film transistor is arranged in each pixel, an electric charge held in a pixel electrode is controlled by using the thin film transistor as a switch. Since the active matrix type liquid crystal display device is capable of displaying a fine image at a high speed, the device can be used in displays for various electronic apparatuses (for example, a portable word processor, and a portable computer or the like).

As a thin film transistor used in the active matrix type liquid crystal display device, an amorphous silicon thin film is commonly used. However, the thin film transistor using the amorphous silicon thin film has the following problems.

(1) The liquid crystal thin film transistor has low characteristics and cannot display a higher quality image.

(2) The liquid crystal thin film transistor cannot constitute a peripheral circuit for driving a thin film transistor arranged on a pixel.

The aforementioned second problem can be considered by dividing the problem into the following two aspects. One aspect of the problem is that since a P-channel type thin film transistor cannot be used for practical purposes with the thin film transistor using an amorphous silicon thin film, a CMOS circuit cannot be constituted. Another aspect of the problem is that since the thin film transistor using an amorphous silicon thin film cannot be operated at a high speed, and a large current cannot flow in the thin film transistor, a peripheral driving circuit cannot be assembled.

Means for solving the aforementioned problems include a technology for forming a thin film transistor by using a crystalline silicon thin film. The methods for obtaining a crystalline thin film include a method for heat treating an amorphous silicon film and a method for irradiating the amorphous silicon thin film with laser light.

SUMMARY OF THE INVENTION

However, a method for crystallizing an amorphous silicon film by heat treatment in the prior art has the following problem.

In the case where a thin film transistor is constituted which is used in a liquid crystal electro-optical apparatus, it is demanded that the thin film transistor is formed on a translucent substrate. Examples of the translucent substrate include a quartz substrate and a glass substrate. However, the quartz substrate is expensive and cannot be used in the liquid crystal electro-optical device which has a large technological problem of a cost reduction. Consequently, the glass substrate is commonly used. However, it has a problem of a low heat resistance.

Generally, as the glass substrate used in the liquid crystal electro-optical device, Corning 7059 glass substrate is used. The strain point of this glass substrate is 593° C. When the substrate is heat treated at this temperature or more, the shrinkage or the deformation of the substrate becomes conspicuous. In recent years, the liquid crystal electro-optical device tends to have a larger area and the shrinkage and the deformation of the substrate must be suppressed as much as possible.

However, it has been probed by experiment that a temperature of 600° C. or more is required to crystallize the amorphous silicon film by heating. It is also made clear that tens of hours are required for heating. A large area glass substrate cannot be subjected to such high temperature and long hour heating at all.

Further, a technology of crystallizing the amorphous silicon film by laser light irradiation is also known. However, it is difficult as a practical problem to irradiate uniformly a large area with laser light and to irradiate the area while keeping a definite level of irradiation power.

An object of the present invention is to solve the aforementioned problems and to provide a technology of transforming the amorphous silicon film into a crystalline silicon film by heat treatment at an extremely low temperature. In particular, an object of the invention is to provide a crystalline silicon thin film which is capable of constituting a thin film transistor with a high performance characteristics.

In accordance with a major aspect of the present invention, there is provided a method for fabricating a semiconductor thin film comprising the steps of:

introducing into an amorphous silicon film a metal element which promotes the crystallization of silicon;

obtaining a crystalline silicon film by crystallizing the aforementioned amorphous silicon film by heat treatment;

forming a metal element diffusion film on said crystalline silicon film;

diffusing the aforementioned metal element into the aforementioned metal element diffusion film; and removing the metal element diffusion film into which the metal element has been diffused.

In the aforementioned structure, examples of the amorphous silicon film include a film which is formed by plasma CVD or by low pressure thermal CVD on a glass substrate or on a glass substrate on which an insulating film is formed.

Further, examples of the metal element which promotes the crystallization of the aforementioned silicon include one or more kinds of elements selected from Fe, Co, Ni, Ru, Rh, Pd, Os, Ir, Pt, Cu and Au. Among these metal elements, the most effective metal element is nickel (Ni).

Methods for introducing the metal element which promotes the crystallization of the aforementioned silicon include a method for providing these metal layers or a layer including the metal on the surface of the amorphous silicon film. Specifically, the methods include a method for forming a metal element layer or a layer including a metal element by the CVD, the sputtering process, vapor deposition or the like, and a method for coating a solution containing a metal element on the amorphous silicon film. In particular, since the latter method using the latter solution enables easily controlling a density of the metal element, the latter method is more favorable than the former method. In addition, since the metal element can be held uniformly in contact with the surface of the amorphous silicon film in the latter method. the latter method is very favorable in this respect, too. For reference, when the aforementioned CVD and the sputtering process, vapor deposition or the like is used, it is difficult to form an extremely thin uniform film. Consequently, there is a problem in that the metal element is non-uniformly present on the amorphous silicon film, and the metal element is liable to be deviated at the time of the crystal growth.

To crystallize by heating the silicon film to which the metal element promoting the crystallization of silicon is introduced, the silicon film may be heated at a temperature of 450° C. or more. The upper limit of this heating temperature is limited by the heat-resistant temperature of the glass substrate used as the substrate. In the case of the glass substrate, the heat resistant temperature can be regarded as the strain point of glass. When materials such as quartz substrate or the like which can endure a temperature of 1000° C. or more, the heating temperature in heating can be heightened in accordance with the heat insulating temperature.

As one example of heat treatment, it is appropriate to set the temperature to about 550° C. from the viewpoint of the heat resistance and the productivity of the glass substrate.

An amorphous silicon film used as the metal element diffusion film and formed on crystalline silicon film crystallized as a result of heat treatment may be formed by the general CVD process. For example, the same method as used for forming the crystalline silicon film by introducing the metal element into the amorphous silicon starting film and crystallizing the amorphous silicon starting film by heating is used.

However, more preferably, the film may be of the quality such that a defect density is high and the metal element can be easily trapped. This is because the metal element in the crystalline silicon film can be easily dispersed in the metal element diffusion film comprising silicon.

The defect density can be set to a high level by using such means as forming the film only of silane without using hydrogen in accordance with the plasma CVD, using the sputtering method, or lowering the temperature at which the film is formed in accordance with the plasma CVD.

It is more advantageous to increase the thickness of this amorphous silicon film with respect to the thickness of the crystalline silicon film. This is because when the amorphous silicon film is thicker than the crystalline silicon film, the volume ratio with respect to the crystalline silicon film can be increased, and more metal elements can be dispersed in the amorphous silicon film.

A polycrystalline silicon film and an amorphous $Si_xGe_{1-x}$ film (0<x<1) can be used as the metal element diffusion film. The polycrystalline silicon film can be formed by low pressure CVD. The amorphous $Si_xGe_{1-x}$ film can be formed by plasma CVD using silane ($SiH_4$) and germane ($GeH_4$) as a raw material gas.

The step of diffusing (absorbing) the metal element in the crystalline silicon film is carried out by heat treatment. Since the metal element in the crystalline silicon film is diffused into the metal element diffusion film by the heat treatment, the metal element concentration is lowered in the crystalline silicon film.

Next, the metal element diffusion film into which the metal element has been diffused is removed. This removal can be a selective etching of the metal element diffusion film by forming an oxide film as an etching stopper on the silicon film to be crystallized.

A more detailed explanation of this method is described using FIG. 1. First, a crystalline silicon film 105 is formed on a glass substrate 101 using nickel as a metal element which promotes crystallization of silicon. Reference numeral 102 designates a base silicon oxide film. Heat treatment is used for the crystallization. (FIG. 1(B))

Figure 1A:
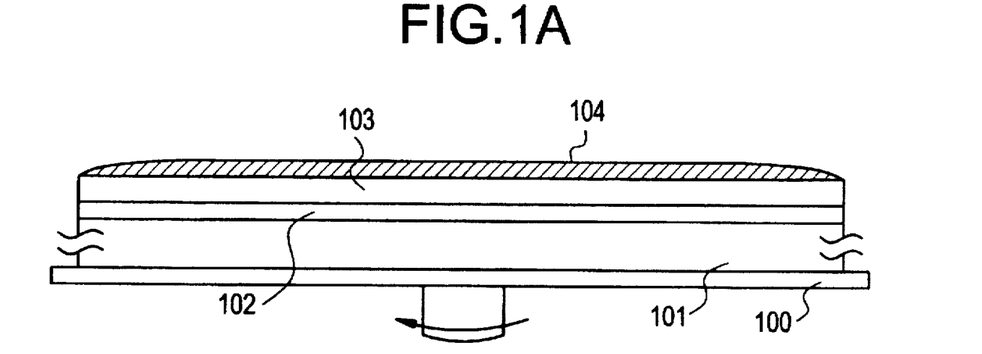
FIGS. 1(A) to 1(D) are views showing a step of fabricating a crystalline silicon film.
Figure 1B:
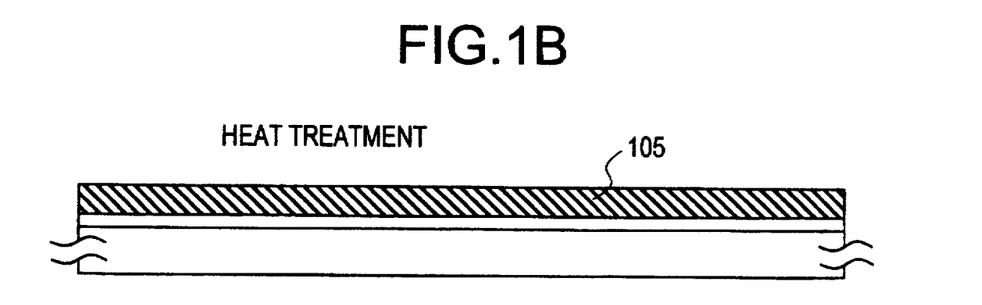
Figure 1C:
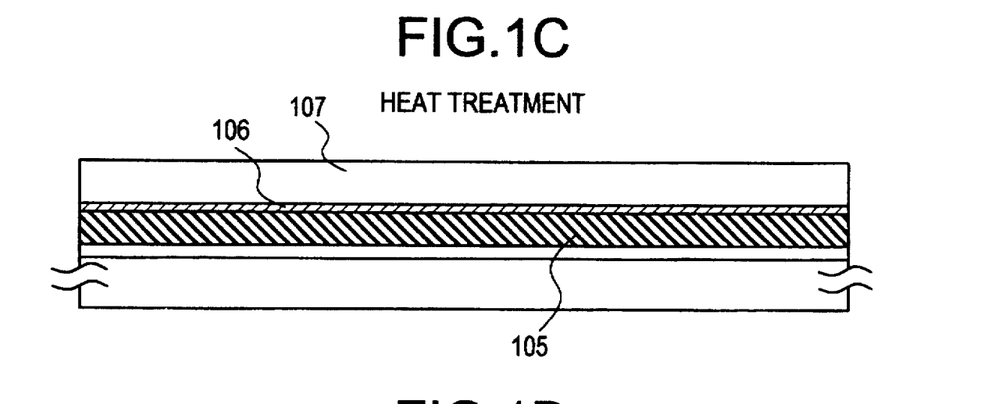

Next as shown in FIG. 1(C), an oxide film 106 is formed, and an amorphous silicon film 107 is formed as the metal element diffusion film and heat treated.

This heat treatment can be classified into two methods; one method is the one which is carried out at a temperature (generally, 450° C. or less) at which the amorphous silicon film is not crystallized while the other method is one which is carried out at a temperature (generally, 450° C. or more, and preferably 500° C. or more) at which the amorphous silicon film is crystallized.

When the heat treatment is carried out at a temperature at which the amorphous silicon film 107 provided on the crystalline silicon film 105 is not crystallized, the temperature of the heat treatment is 400° C. to 450° C. and the heating duration is 5 minutes to 10 hours. The metal element in the crystalline silicon film is gradually absorbed into the amorphous silicon film 107 by this heat treatment. Consequently, when the heat treatment is carried out over a long period, the density of the metal element in the crystalline silicon film 105 can be gradually decreased.

By removing the amorphous silicon film 107 using the oxide film 106 as an etching stopper, a crystalline silicon film 108 containing a metal element at a low concentration therein as compared with the metal element concentration in the amorphous silicon film 107 can be obtained. (FIG. 1(D)) This is because the silicon atom is present in the amorphous silicon film 107 in the state that the silicon atom is liable to be connected with the metal element (in the amorphous state, a large quantity of unpaired bonds are present). Further, this action can be conspicuously obtained when the defect density is artificially increased in the amorphous silicon film 107.

In the meantime, when the amorphous silicon film is heated at a temperature at which the crystallization of the amorphous silicon film 107 provided on the crystalline silicon film 105 proceeds, the dispersion of the metal element is ostensibly suspended in the state in which the amorphous silicon 107 is crystallized. Then when the average value of the density of the metal element in the crystalline silicon film 105 and the density of the metal element in the silicon film 107 for absorbing the metal element (crystallized in heat treatment) become approximately equal to each other, the dispersion of the metal element is ostensibly suspended.

However, it has been made clear that the metal element is locally concentrated in the crystalline silicon film 105. This method becomes effective for suppressing this phenomenon. Therefore, this is a method which is intended to produce a state in which no concentration of the metal element exists in the silicon film to be used in the fabrication of the device by using the phenomenon that the metal element is concentrated on the tip part of the crystal growth to dispel the tip of the crystal growth to the silicon film to be removed later.

Figure 1D:
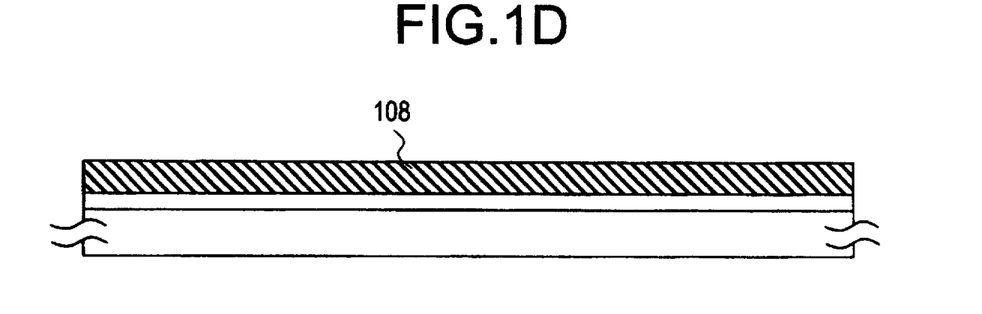

Then, heat treatment is carried out at the temperature at which the amorphous silicon film 107 is crystallized to crystallize the amorphous silicon film 107. At this occasion, the crystal growth proceeds from a surface at which the silicon film 107 contacts the oxide film 106 to the exposed surface thereof. Then, at the same time with this crystal growth, a portion where the metal element is concentrated moves in the silicon film 107. As a consequence, a portion where a nickel element is concentrated is dispelled from the silicon film 105 so that the nickel element exists in the silicon film 107 (particularly on the surface thereof). Then, a crystalline silicon film 108 free from an area where the nickel element is deviated can be obtained by removing the silicon film 107 using the oxide film 106 as an etching stopper (FIG. 1 (D)).

An amorphous silicon film is formed on the surface of the crystalline silicon film crystallized with the action of metal which promotes the crystallization, followed by heat treatment to disperse the metal element into the amorphous silicon film. In this manner, the metal element in the crystalline silicon film can be virtually sucked out thereby making it possible to obtain a crystalline silicon film having a low density of metal element and having a crystallinity.

In addition, since all these steps can be carried out at a temperature such as 550° C. or less which the glass substrate can endure, the steps are extremely useful in the formation of a crystalline thin film silicon semiconductor used for constructing a thin film transistor used in a liquid crystal electro-optical device using, for example, a glass substrate.

To facilitate the removal of the silicon film for the absorption of the metal element, it is effective to form an oxide film on the crystalline silicon film. Since the oxide film has a selectivity with respect to an etchant (for example, hydradine and $ClF_3$), the oxide film can serve as an etching stopper.

Further, on a surface of the crystalline silicon film (first silicon film) crystallized with the action of the metal promoting the crystallization, an amorphous silicon film (second silicon film) is formed. Thereafter, heat treatment is carried out to crystallize the second layer amorphous silicon film with the result that the concentrated portion of the metal element which is present in the first silicon film can be dispelled into the second silicon film thereby suppressing the deviation of the metal element in the first silicon film.

DETAILED DESCRIPTION OF THE PREFERRED EMBODIMENTS

Embodiment 1

Embodiment 1 relates to a technology of dispersing a nickel element into an amorphous silicon film from a crystalline silicon film (allowing the amorphous silicon film to suck the nickel element) to lower a density of the nickel element in the crystalline silicon film as a consequence, by forming an amorphous silicon film, introducing into the amorphous silicon film a metal film which promotes the crystallization of silicon film, forming an amorphous silicon film on a crystallized silicon film (crystalline silicon film) via an oxide film (silicon oxide film), followed by performing heat treatment again.

FIG. 1 shows a step of fabricating a crystalline silicon film described in this embodiment. In the beginning, on Corning 7059 glass substrate 101 (having a strain point of 593° C.), a silicon oxide film 102 is formed to a thickness of 3000 Å as a base film. The silicon oxide film 102 is intended to prevent impurities and alkaline ions from being dispersed into the semiconductor thin film from the glass substrate 101. Then, the amorphous silicon film 103 is formed to a thickness of 600 Å by the plasma CVD and the low pressure thermal CVD. Then, a nickel acetate solution which is adjusted to a predetermined nickel density is dripped on the amorphous silicon film 103 to form a water film 104. Then, the spinner 100 is used for spin coating to produce a state in which the nickel element is held in contact with the surface of the amorphous silicon film 103 (FIG. 1 (A)).

Subsequently, the amorphous silicon film 103 is crystallized by heat treatment to obtain a crystalline silicon film 105. The heat treatment can be carried out at a heating temperature of 450° C. or more, or preferably, 500° C. or more. However, in consideration of heat resistance of the glass substrate 101, preferably, the temperature is set to a strain point of the glass substrate 101 or less. Incidentally, when the heat treatment is carried out at a temperature of 500° C. or less, the heat treatment requires tens of hours or more. Thus, the method is not practical.

The density of nickel in this crystalline silicon film 105 is required to be set to $1\times10^{16}$ atom cm$^{-3}$ to $5\times10^{19}$ atom cm$^{-3}$ if possible. Consequently, it is necessary to adjust the nickel density in the crystalline silicon film 105 thus obtained to the aforementioned range at the step shown in FIG. 1(A). Incidentally, the nickel density is defined as a minimum value measured by using the SIMS (secondary ion mass spectrometer).

When the crystalline silicon film 105 is obtained, a silicon oxide film 106 is formed on the surface of the film 105. The thickness of the silicon oxide film 106 may be set to about tens of Å to about 100 Å. Such a thin film is formed because the nickel element in the crystalline silicon film is required to move via the silicon oxide film 106. Here, an extremely thin silicon oxide film 106 is formed by the UV light irradiation in the air. Even when this thin silicon oxide film 106 is as thick as a natural oxide film, it has been made clear that the thin film 106 serves as an etching stopper in the subsequent step of etching of the amorphous silicon film (denoted by 107). Thus the thin film 106 may be as thick as the aforementioned thickness. Here, the silicon oxide film 106 is formed by using the UV oxidation process, but the silicon oxide film may be formed by the thermal oxidation process.

This silicon oxide film 106 serves as an etching stopper in the later etching step, and the silicon oxide film 106 can be used as long as it provides a selectivity with respect to the crystalline silicon film 105. For example, in the place of the silicon oxide film 106, an extremely thin silicon nitride film can be used.

Subsequently, the amorphous silicon film 107 is formed to a thickness of 600 Å by the plasma CVD and low pressure CVD.

Figure 2:
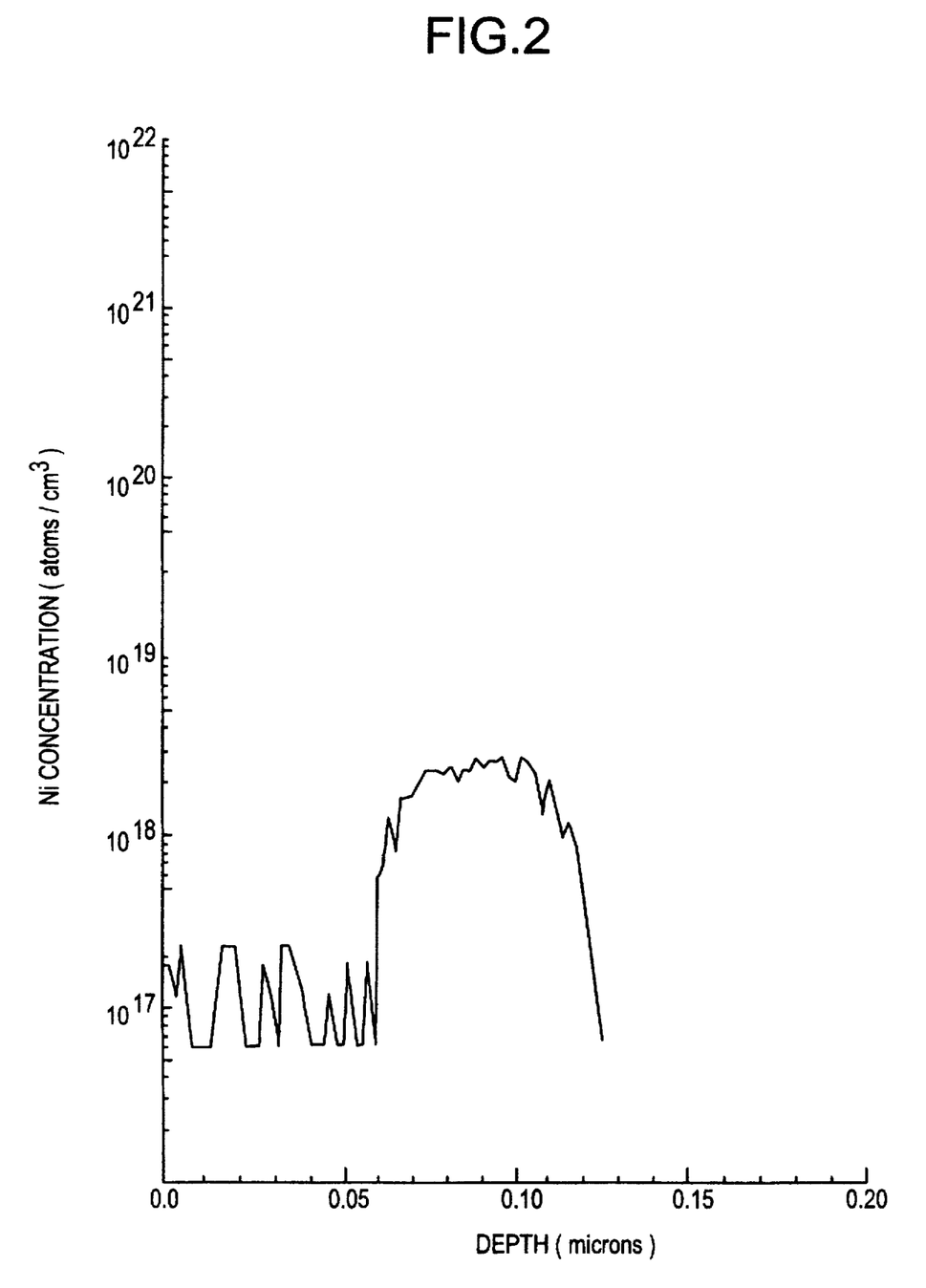
FIG. 2 is a view showing a density distribution of a nickel element.

FIG. 2 shows a density distribution of the nickel element in the direction of the film thickness by using SIMS (secondary ion mass spectrometer). What is shown in FIG. 2 is a distribution of the nickel element in the depth direction from the surface of the amorphous silicon film 107. As apparent in FIG. 2, it is made clear that the nickel element in the amorphous silicon film 107 is less than the measurement limit (here, in this case, $1 \times 10^{17}$ atom cm$^{-3}$), and a maximum of about $5 \times 10^{18}$ atom cm$^{-3}$ of the nickel element is present in the crystalline silicon film 105.

Then the nickel element in the crystalline silicon film 105 is dispersed in the amorphous silicon film 107 via an oxide film 106 by heat treatment. This step can be understood as a step of sucking out the nickel element in the crystalline silicon film 105 (FIG. 1 (C)).

This step of heat treatment is carried out at a temperature of from 400° to 450° C. at which the amorphous silicon film 107 is not crystallized. In this embodiment, the heat treatment is carried out at 450° C. for two hours. When this heat treatment is carried out, the nickel element in the crystalline silicon film 105 is dispersed in the amorphous silicon film 107 thereby making it possible to lower the density of the nickel element in the crystalline silicon film 105.

Generally, when the thickness of the amorphous silicon film 107 is set to not less than the thickness of the crystalline silicon film 105, the density of the nickel element in the crystalline silicon film 105 can be set to a half or less by carrying out the aforementioned heat treatment.

Figure 3:
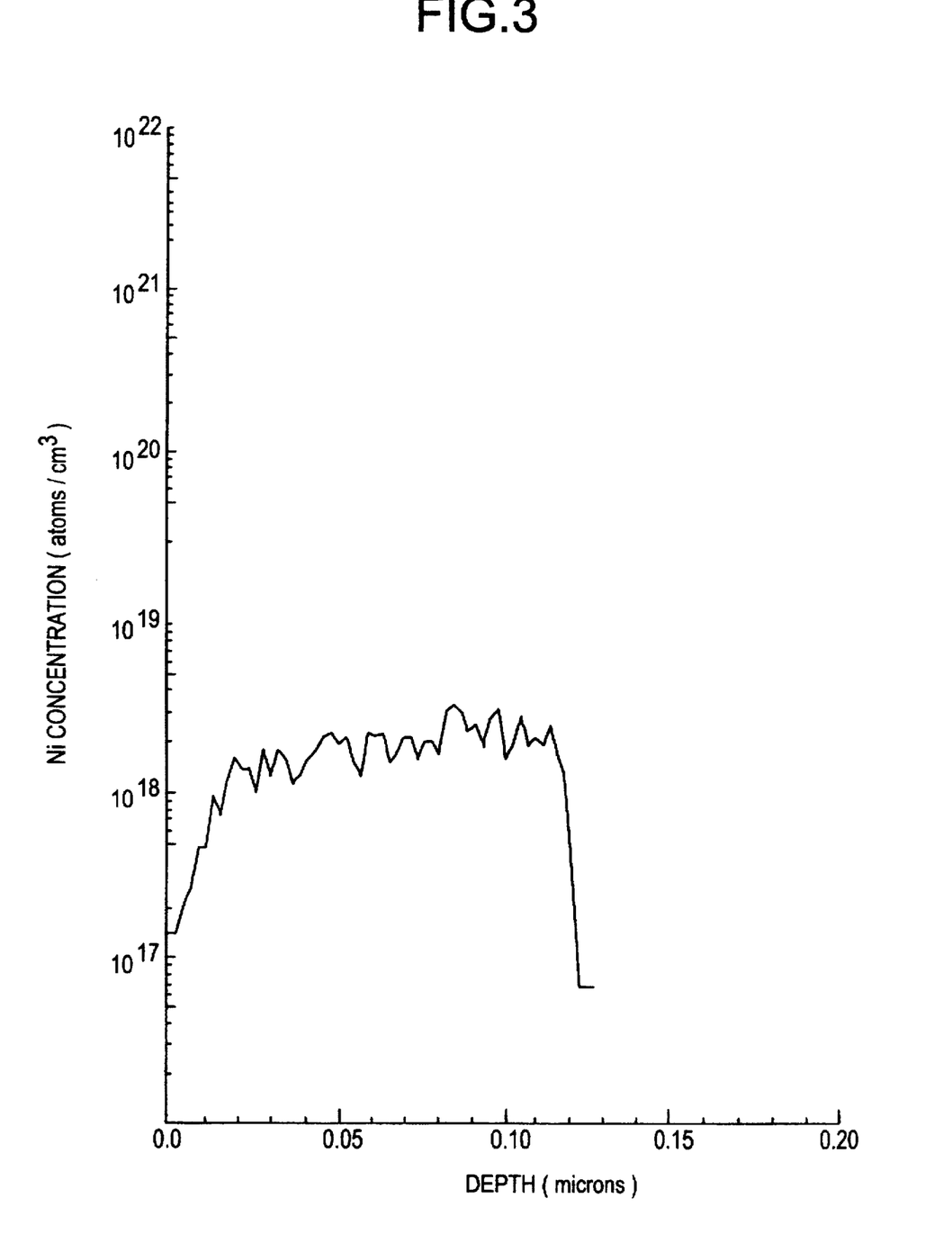
FIG. 3 is a view showing a density distribution of the nickel element.

FIG. 3 shows a density distribution of the nickel element in the film thickness direction in a state in which the heat treatment is carried out for two hours. Data shown in FIG. 3 is made with the same measurement method as data shown in FIG. 2.

As is apparent in FIG. 3, nickel is dispersed in the amorphous silicon film 107. However, it can be seen in FIG. 3 that the density of nickel is somewhat higher in the crystalline silicon film 105. From FIG. 3, it can be understood that the nickel element in the crystalline film 105 is absorbed in the amorphous silicon film 107 at the step of heat treatment shown in FIG. 1 (C).

Figure 4:
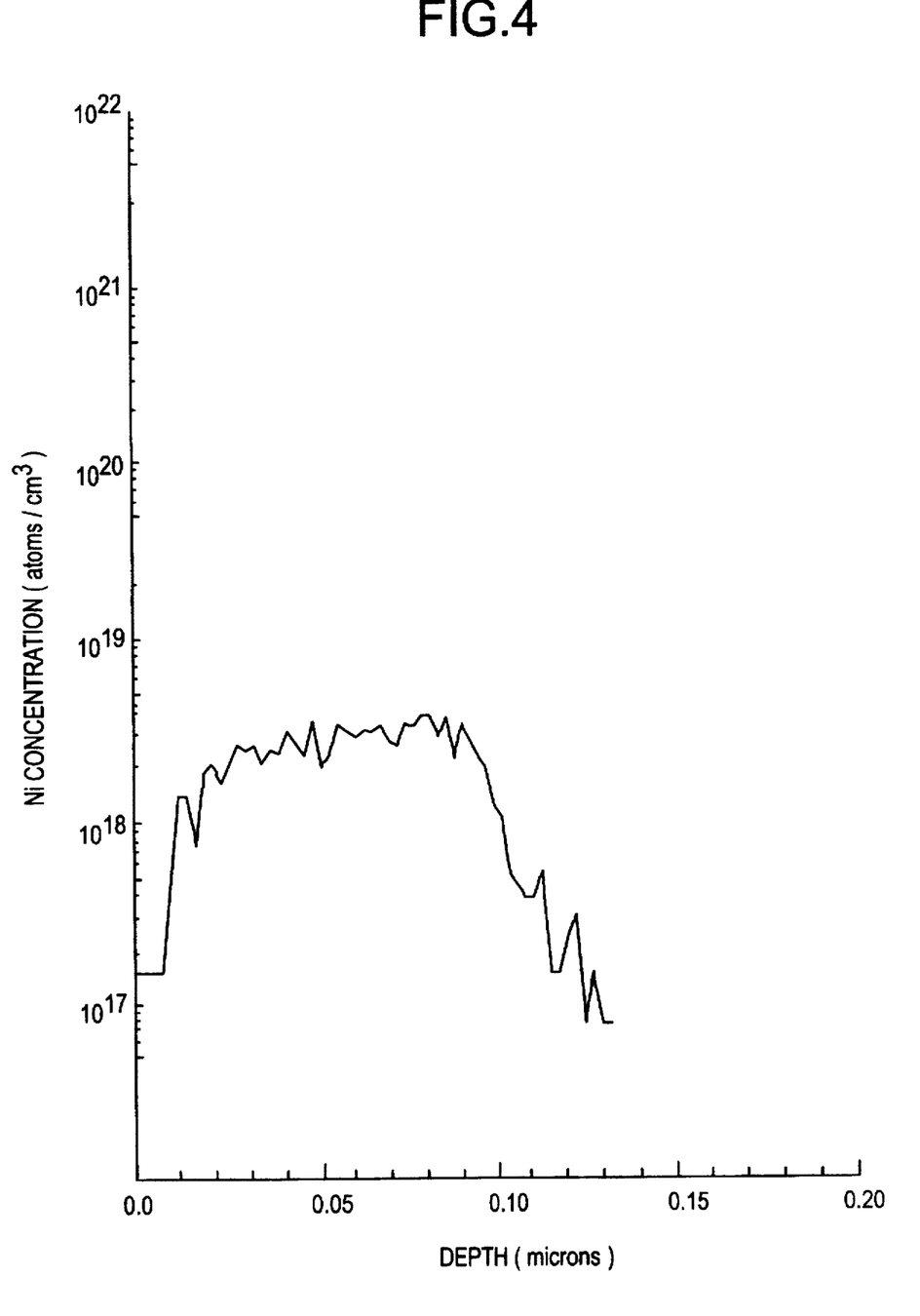
FIG. 4 is a view showing a density distribution of the nickel element.

FIG. 4 shows a density distribution of nickel in four hour heat treatment at 450° C. when two hour heat treatment is further carried out at 450° C. after data shown in FIG. 3 is obtained. (Finally, four hour treatment is carried out at 450° C.) As is apparent in a comparison between FIGS. 3 and 4, it can be seen that the nickel element in the crystalline silicon film 105 is gradually sucked into the amorphous silicon film 107. It is considered that a large amount of unpaired bonds and a large number of silicon atoms to which nickel can be easily bonded exist in the amorphous silicon film 107. Further, the nickel density in the crystalline silicon film 105 can be gradually lowered by carrying out a long hour heat treatment. Such an action is a feature that cannot be observed when the amorphous silicon film 107 is crystallized.

Then, the amorphous silicon film 107 is removed by etching. Here, as an etchant of the amorphous silicon film 107, hydradine ($N_2H_6$) is used. When hydradine is used as an etchant, the amorphous silicon film 107 has a faster etching rate than the crystalline silicon film 105. Further, in the present embodiment, an oxide silicon film 106 which cannot be etched with hydradine (the etching rate is extremely low, and in a relative viewpoint, it can be regarded that etching cannot be performed) is formed on the crystalline silicon film as an etching stopper. Therefore, only the amorphous silicon film 107 which has sucked out nickel can be selectively removed. Incidentally, dry etching may be used for etching the amorphous silicon film 107.

Subsequently, the silicon oxide film 106 is removed with buffer acid and fluorine nitride to obtain a crystalline silicon film 108 in which the density of the contained nickel element as shown in FIG. 1 (D) can be lowered. The density of the nickel element in this crystalline silicon film 108 is, for example, about $3 \times 10^{18}$ atom cm$^{-3}$. As apparent in the comparison with FIG. 2, this value means that the density of the nickel element can be lowered to a half (a half or less in average).

In this embodiment, the thickness of the amorphous silicon film 107 which is formed on the crystalline silicon film 105 is set to the same thickness as the thickness of the crystalline silicon film 105. However, the density of the nickel element which is contained in the crystalline silicon film 108 which is finally obtained can be further lowered by increasing the thickness of the amorphous silicon film 107. That is, a larger amount of the nickel element can be sucked out into the amorphous silicon film 107 by increasing the volume of the amorphous silicon film 107 compared with the volume of the crystalline silicon film 105.

With the adoption of the structure of this embodiment, the density of nickel in the crystalline silicon film 108 thus obtained can be set to $5 \times 10^{18}$ atom cm$^{-3}$ or less.

Embodiment 2

Embodiment 2 is characterized in that the step of heat treatment in the fabrication process in embodiment 1 is carried out by setting the conditions as follows; heating temperature is 550° C., and heating duration is four hours. When the heat treatment step shown in FIG. 1 (c) is carried out at 550° C. for four hours, the amorphous silicon film denoted by 107 is crystallized with the action of the nickel element which is dispersed from the crystalline silicon film 105.

At this time, the crystallization advances in a direction of heading from the crystalline silicon film 105 to the amorphous silicon film 107 via the oxide film 106. As described above, the metal element which promotes the crystallization of silicon tends to be concentrated at the tip portion of the crystal growth. Consequently, an area where the nickel element is concentrated exist in the crystallized silicon film 107 (which is transformed into a crystalline film at this stage). Then naturally the density of nickel in the crystalline silicon film is decreased.

Further, the nickel element deviated area which is present on the surface of the crystalline silicon film 105 moves together with the tip portion of the crystal growth along with the advancement of the progress of the crystallization of the amorphous silicon film 107. That is, the nickel element deviated area will be present in the silicon film 107 (which is here designated as a crystallized state) after the termination of the crystallization. Consequently, the nickel element deviated area on the surface of the crystalline silicon film 105 can be eliminated.

In the case where the amorphous silicon film 107 has been crystallized in this manner, it is feared whether or not this crystallized silicon film can be selectively removed. Since the silicon oxide film 106 is formed which serves as an etching stopper, only the silicon film denoted by 107 (crystallized in this case crystallized) can be selectively removed. In other words, when etching is carried out using hydradine and $ClF_3$ gas, the etching rate of oxide film denoted by reference numeral 106 is extremely small compared with the etching rate of the silicon film denoted by reference numeral 107. Thus the etching is suspended when the etching of the silicon film 107 is ended.

When the structure shown in embodiment 2 is adopted, the heat treatment step shown in FIG. 1 (C) can be performed under the same condition as the heat treatment as FIG. 1(B).

Embodiment 3

Embodiment 3 shows an example of fabricating a thin film transistor by using the crystalline silicon film which is obtained by the method for fabricating the silicon film shown in embodiments 1 and 2. Referring to FIG. 5, there is shown a method for fabricating the thin film transistor. In the beginning, a crystalline silicon film 503 is formed on the glass substrate 501 on which a base film 502 is formed by using a method shown in embodiments 1 and 2. (FIG. 5(A))

Figure 5A:
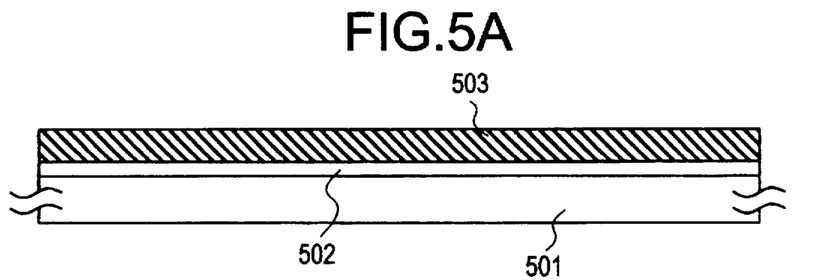
FIGS. 5(A) to 5(D) are views showing a step of fabricating a thin film transistor.
Figure 5B:
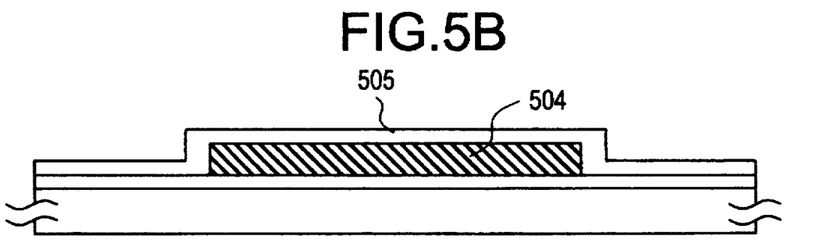

Subsequently, the crystalline silicon film 503 thus obtained is patterned to form an active layer of the thin film transistor as shown by reference numeral 504. Then a silicon oxide film 505 is formed to a thickness of 1000 Å which functions as a gate insulating film by the plasma CVD and the low pressure thermal CVD. (FIG. 5 (B))

Figure 5C:
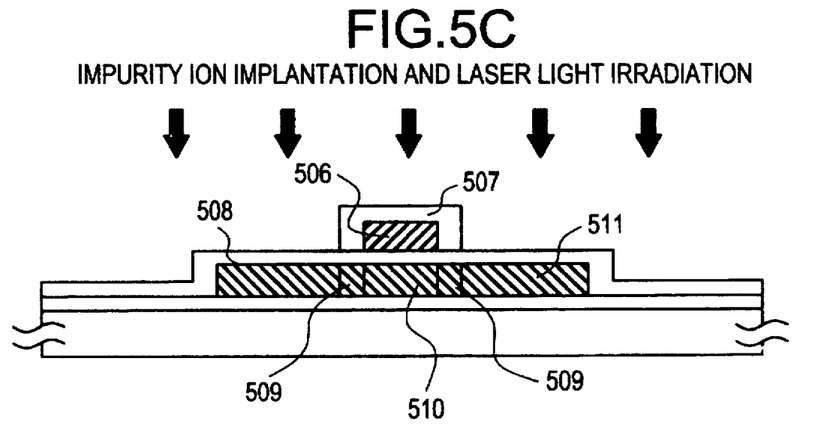
Figure 5D:
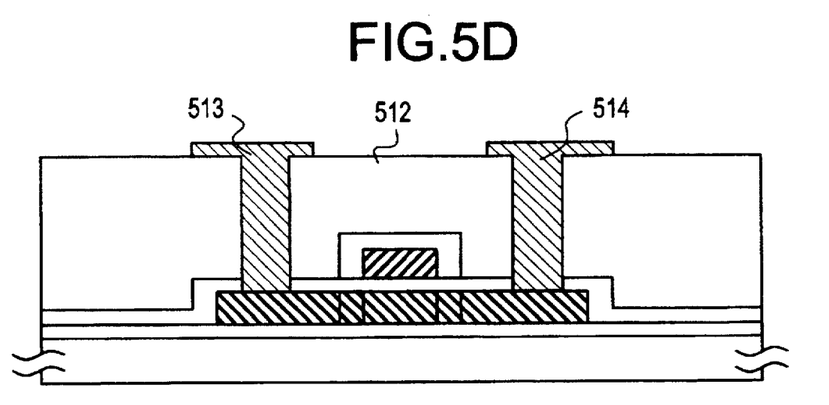

Then an aluminum film containing scandium is formed to a thickness of 6000 Å followed by patterning the film to form a gate electrode denoted by reference numeral 506. Further, in the electrolyte, anodic oxidation is carried out by using the gate electrode 506 as an anode to form an oxide layer 507. The thickness of the oxide layer 507 is set to 2000 Å. It is possible to form an offset gate area to a thickness of this oxide layer 507 at the subsequent step (FIG. 5 (C)).

Then, impurity ions are doped into the active layer 504. Here, phosphorus ions are doped as an impurity ion. At this step, phosphorus ions are doped into an area denoted by reference numerals 508 and 511. The area denoted by reference numerals 508 and 511 constitute a source area and a drain area. Further, an area denoted by reference numeral 509 constitutes an offset area. Further, the area denoted by reference numeral 510 constitutes a channel formation area.

After the completion of the impurity ion doping, the silicon film is irradiated with laser light to activate the doped ions and to anneal the source and drain areas 508 and 511 that has been damaged at the time of ion doping. (FIG. 5(C))

Subsequently, a silicon oxide film 512 is formed as an interlayer insulating film and then a contact hole is formed to form a source electrode 513 and a drain electrode 514 by using aluminum. Further, a thin film transistor is completed by heat treatment in the hydrogen atmosphere of 350° C. (FIG. 5(D)).

Embodiment 4

Embodiment 4 relates to a technology for obtaining a crystalline silicon film which has crystal grown in a direction parallel to the substrate and then lowering the density of nickel in this crystalline silicon film by selectively introducing nickel which is a metal element that promotes the crystallization of silicon.

Figure 6A:
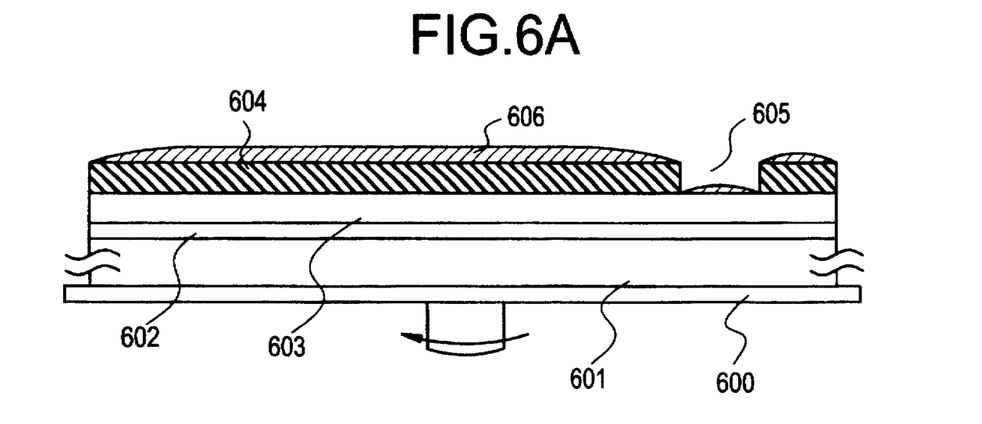
FIGS. 6(A) to 6(D) are views showing a step of fabricating a crystalline silicon film.

In the beginning, a silicon oxide film is formed to have a thickness of 3000 Å as a base film on the glass substrate 601 by the sputtering method. Subsequently, the amorphous silicon film 603 is formed to have a thickness of 500 Å by the plasma CVD or the low pressure thermal CVD.

Subsequently, the amorphous silicon film is irradiated with UV light in the atmosphere of oxygen to form an extremely thin oxide film (not shown) on the surface of the amorphous silicon film 603. This oxide film is intended to improve the moisture characteristics of the solution at the subsequent step of coating the solution.

Then, a resist is used to form a mask 604. The area 605 exposed by the resist mask 604 has a slit-like configuration with a longitudinal direction from the surface side of the paper shown in FIG. 6 (A) to the rear surface of FIG. 6 (A).

Then, a nickel acetate solution containing a predetermined density of nickel is dripped to form a water film 606.

Further, a spinner 600 is used for spin coating to produce a state in which the nickel element is held in contact with the surface of the amorphous silicon film 603 via an oxide film (not shown) in an area denoted by reference numeral 605.

Then, the resist mask 604 is removed. Then the amorphous silicon film 603 is heat treated to be crystallized. In the area designated by reference numeral 605, the nickel element is dispersed from a state in which the nickel element is held in contact with the amorphous silicon film 603 via the oxide film (not shown) into the amorphous silicon film via the oxide film (not shown). Then, as denoted by an arrow 607, the crystal growth proceeds in a direction parallel to the substrate. This crystal growth advances in a column-like or a needle-like configuration. In embodiment 4, since the area denoted by reference numeral 605 has a slit-like configuration with a longitudinal direction from the surface of the paper shown in FIG. 6(A) to the rear surface of FIG. 6 (A). The crystal growth as shown by the arrow 607 advances approximately in one direction. This crystal growth can be carried out over tens of μm to 100 μm or more. (FIG. 6(B))

In this manner, the crystalline silicon film 608 is obtained as shown in FIG. 6 (C). Then, the oxide film 609 is formed to have a thickness of 50 Å by the thermal oxidization method. Moreover, an amorphous silicon film 610 having a thickness of 1000 Å is formed by the plasma CVD or the low pressure thermal CVD.

Then, the heat treatment is carried out at 450° C. for two hours, and causes the nickel element in the crystalline silicon film 608 to be dispersed in the amorphous silicon film 610 via an oxide film 609. The amorphous silicon film 610 is etched with ClF$_3$ gas, and then the oxide film 609 is removed with buffer fluoric acid. Thus the crystalline silicon film 611 having a lowered nickel density as shown in FIG. 6(D) can be obtained. This crystalline silicon film 611 is characterized in that the crystalline silicon film 611 has an area which is crystal grown in a direction parallel to the substrate as denoted by reference numeral 607 and, further, the nickel density is low.

An experiment has made clear that somewhat large amount of nickel which is introduced into the area shown by reference numeral 605 can have a longer distance of crystal growth in a direction parallel to the substrate (which is referred to a longitudinal direction growth). However, in the meantime, a larger amount of the introduced nickel element can be a factor of heightening the nickel element concentration in the silicon film. Therefore the large amount of introduced nickel is not favorable. This is because when the nickel density in the film is increased ($5 \times 10^{19}$ atom cm$^{-3}$ or more in the experiment), a problem becomes apparent in that the characteristic of the silicon film is deteriorated or the operation of thin film transistors becomes unstable and the deterioration of characteristic becomes drastic.

However, as shown in Embodiment 4, the present invention can meet the following two demands at the same time by removing the nickel element after the completion of crystallization; a demand that the distance of crystal growth in the longitudinal direction be prolonged in the horizontal direction, and a demand that the nickel density (density of metal element) in the obtained crystalline silicon film 611 be lowered as much as possible.

Embodiment 5

Embodiment 5 shows an example in which a crystalline silicon film obtained in embodiment 4 is used to constitute a thin film transistor. FIG. 7 shows a fabrication step in embodiment 5. In the beginning, a crystalline silicon film as shown by reference numeral 611 in FIG. 6(D) has an area which has crystal grown in a direction parallel to the substrate.

Figure 7A:
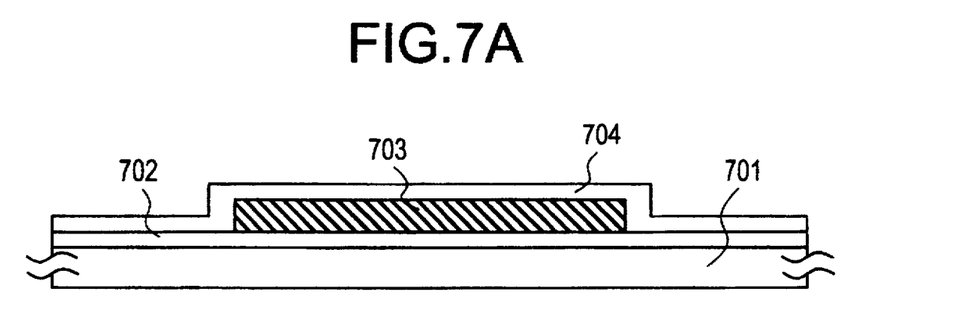
FIGS. 7(A) to 7(C) are views showing a step of fabricating a thin film transistor.

Subsequently, as shown in FIG. 7(A), an active layer 703 of the thin film transistor is formed by patterning the crystalline silicon film. In FIG. 7(A), reference numeral 701 denotes a glass substrate while reference numeral 702 denotes a silicon oxide film as the base film.

Figure 6B:
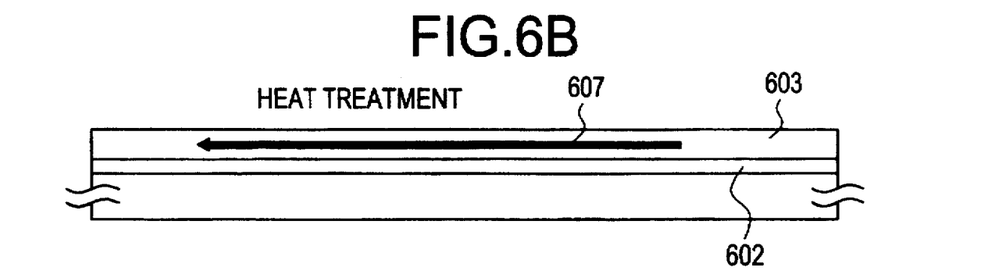
Figure 6C:
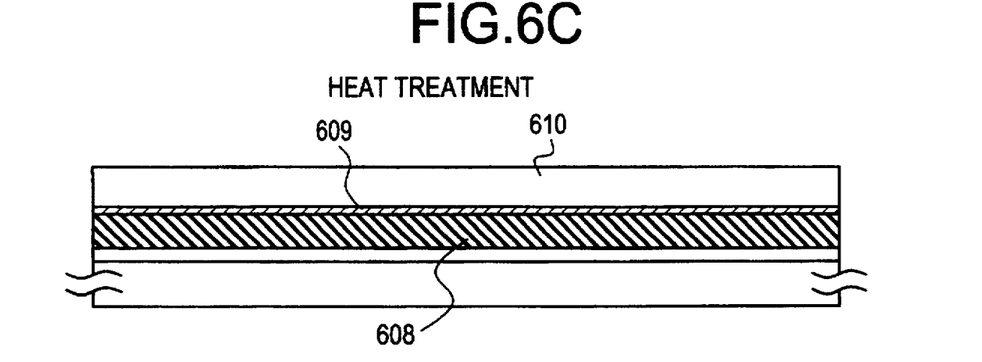
Figure 6D:
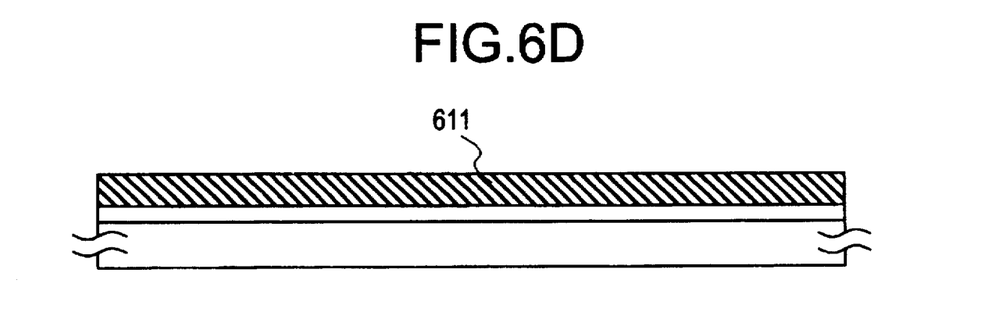

Here, it is important that the beginning and the end of the crystal growth in the crystal growth shown in FIG. 6(B) do not exist in the active layer 703. This is because a high density of nickel is contained in the beginning and the end of the crystal growth.

Further, a silicon oxide film 704 is formed which functions as a gate insulating film to a thickness of 1000 Å by the plasma CVD. (FIG. 7(A))

Subsequently, a film which primarily comprises aluminum is formed followed by patterning the film to form a gate electrode 705. Then, an oxide layer 706 is formed by anodic oxidation in the electrolyte using the gate electrode 705 as an anode. An offset gate area can be formed by the impurity ion doping to a thickness of the oxide layer 706 at the subsequent step of impurity ion doping. (FIG. 7(B)).

Figure 7B:
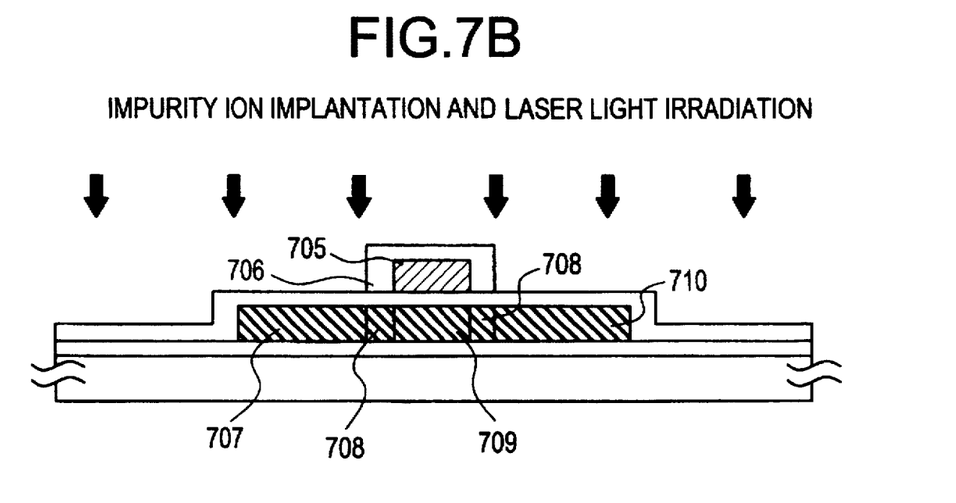

Then, as an impurity ion, phosphorus ions are doped. At this step, a source area 707 and a drain area 710 are formed. Further, an offset gate area 708 and a channel formation area 709 are formed. After the impurity ion doping is completed, the source and the drain areas 707 and 710 are formed by irradiating a laser light or an intense light to activate the source and the drain areas 707 and 710.

Figure 7C:
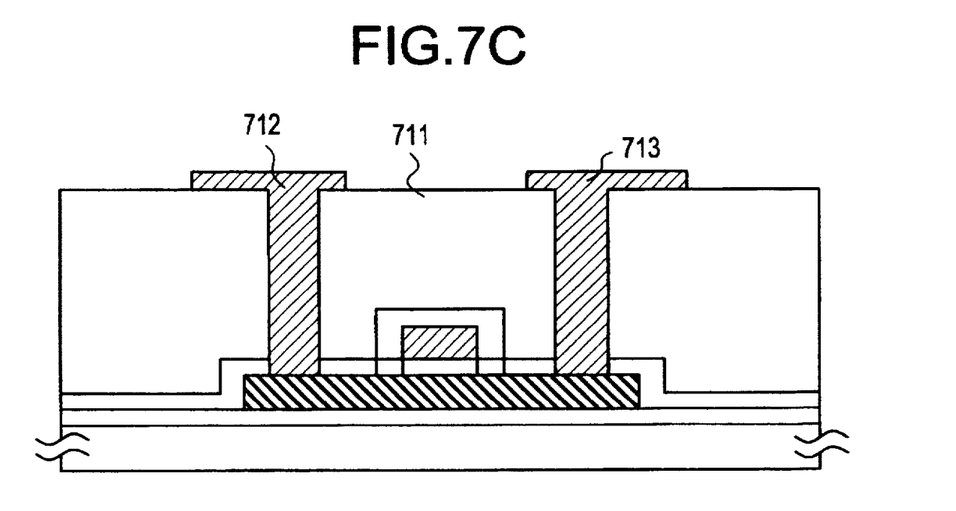

Then, the silicon oxide film 711 which constitutes an interlayer insulating film is formed to a thickness of 6000 Å by plasma CVD. Then, after a contact hole is formed, the source electrode 712 and the drain electrode 713 are formed. Thus, a thin film transistor is completed.

Embodiment 6

Embodiment 6 is characterized in that heat treatment is carried out again after the step of fabricating the crystalline silicon film according to embodiment 1 shown in FIG. 1. When heat treatment is carried out at step shown in FIG. 1(C), nickel (metal element) in the crystalline silicon film 105 is gradually absorbed into the amorphous silicon film 107 as shown in FIG. 4. At this time, the density of nickel in the vicinity of the surface of the crystalline silicon film 105 becomes higher than the nickel density in the vicinity of the interface of the silicon oxide film 102 on the lower surface of the crystalline silicon film 105. This means that nickel in the crystalline silicon film 105 is sucked out into the amorphous silicon film 107 with the result that nickel element is deviated to the surface side of the crystalline silicon film 105.

Consequently, in the case where a thin film transistor is fabricated by using a crystalline silicon film 108 which is formed on a glass plate 101 as shown in FIG. 1 (D), carriers are to be conducted on the surface of the crystalline silicon film 108. It is not preferable that a high density of nickel exists in an area where carriers are conducted.

Then, in embodiment 6, after a state shown in FIG. 1(D) is obtained, heat treatment is conducted so that nickel is dispersed again in the crystalline silicon film 108. In the heat treatment discussed here, nickel may be dispersed. Therefore, the temperature may be set to 400° C. or more. Further, the upper limit of the temperature is limited by the heat resistance of the glass substrate 101. Consequently, the heating temperature used in embodiment 6 is 400° C. or more, and the temperature may be less than the strain point of the glass substrate.

Figure 8A:
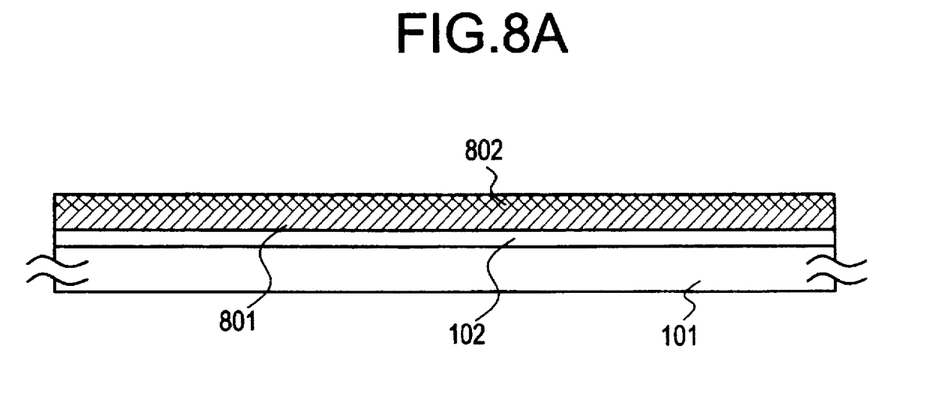
FIGS. 8(A) to 8(C) are views showing a step of fabricating a crystalline silicon film.
Figure 8B:
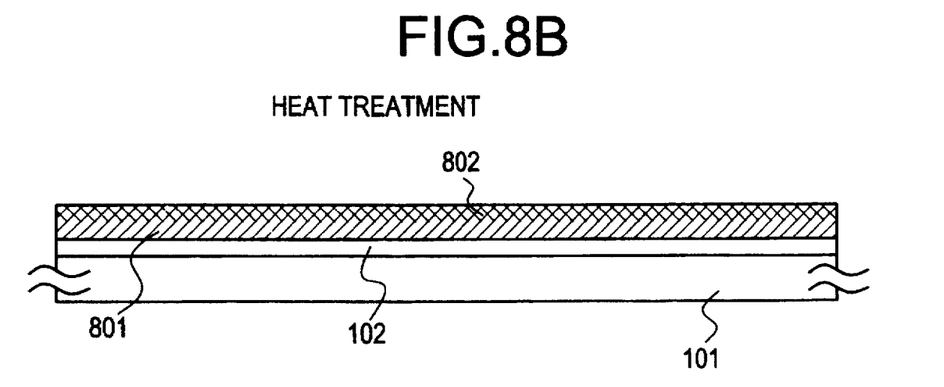
Figure 8C:
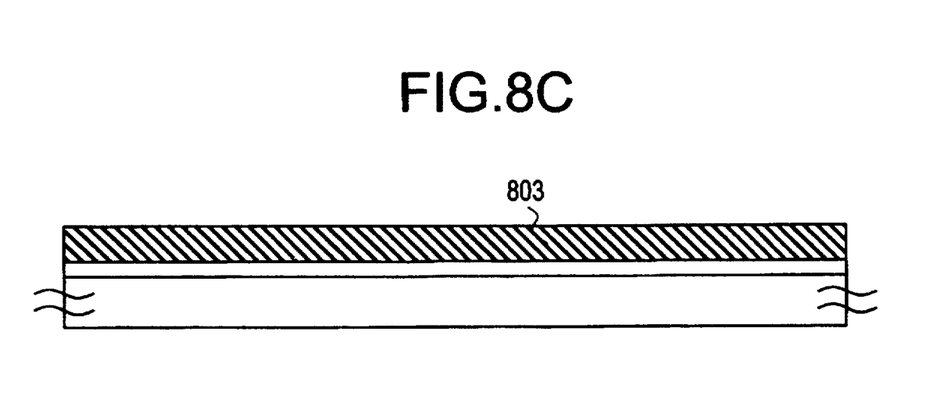

Details of embodiment 6 will be explained in detail by using FIG. 8. In the beginning, after passing through the fabrication step shown in FIG. 1, a state shown in FIG. 1 (D) will be obtained. The state in FIG. 1(D) is described in FIG. 8 (A). FIG. 8(A) shows a layer 802 (on the surface side) in which nickel is segregated and a high density of nickel is contained, and a layer 801 in which nickel is contained with a density lower than that of the layer side denoted by reference numeral 802. These layers 801 and 802 constitute a crystalline silicon film 108 (see FIG. 1(D)) formed on the glass substrate 101 via a base film 102.

In a state shown in FIG. 8(A), the crystalline silicon film is heat treated. Here the film is subjected to two hour heat treatment at 500° C. Consequently, the nickel element in an area denoted by reference numeral 802 is dispersed into an area denoted by reference numeral 801 where the nickel element is present at a low density. In this manner, this area 802 can be in a state in which no segregation of nickel is present. Then, the crystalline silicon film 803 can be obtained where the nickel density on the surface can be lowered. (FIG. 8(C))

Embodiment 7

Figure 9A:
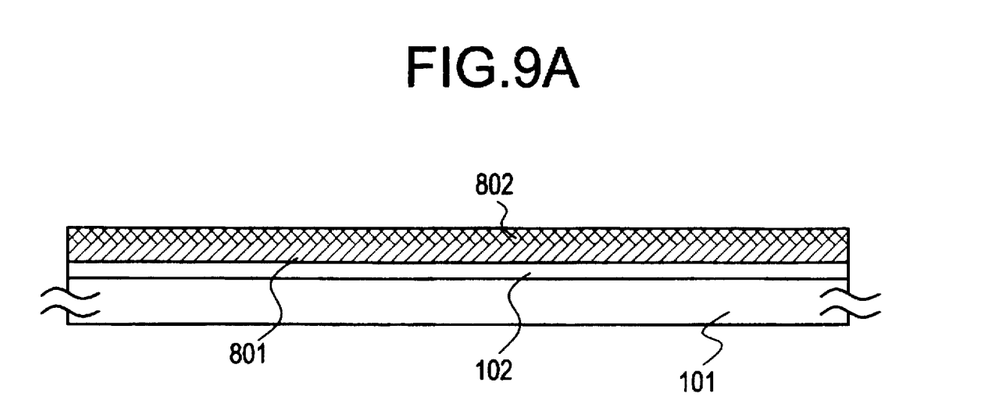
FIGS. 9(A) to 9(C) are views showing a step of fabricating a crystalline silicon film.
Figure 9B:
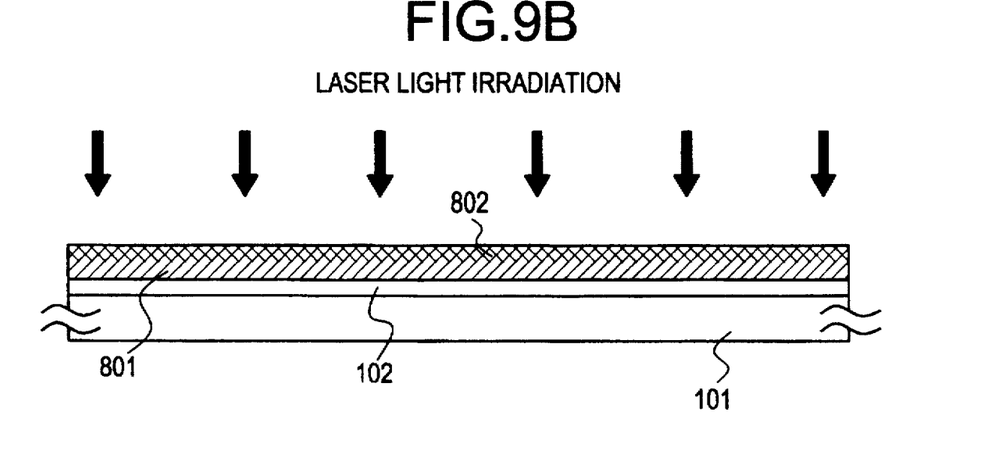
Figure 9C:
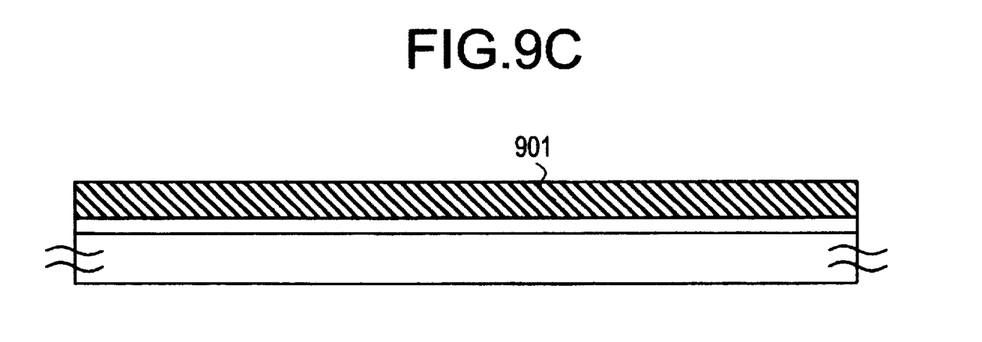

Embodiment 7 is an example in which laser light is irradiated in place of heat treatment at the step of crystallization in the structure shown in embodiment 1. The step of fabricating embodiment 7 is shown in FIG. 9. In the case of Embodiment 7, a layer denoted by reference numeral 802 comprising a crystalline silicon film where nickel is present at a high density in the surface of the crystalline silicon film, and a layer 801 comprising a crystalline silicon film in which the nickel element is present at a low density are obtained. (FIG. 9(A))

Next, a laser light is irradiated to disperse the nickel element from the layer 802 to the layer 801. (FIG. 9(B))

Then, a crystalline silicon film 901 is obtained which has a state in which nickel is uniformly dispersed in the film. (FIG. 9(C))

Embodiment 8

Embodiment 8 is characterized in that an amorphous silicon film 107 shown in FIG. 1(C) is formed in a state in which the defect density is artificially high at the step shown in embodiment 1. At step shown in embodiment 1, the crystalline silicon film 105 contains an average of about $3\times10^{18}$ atom cm$^{-3}$ of the nickel element as shown in FIG. 2. Then, embodiment 7 is characterized by heightening the removing capabilities of the nickel element by setting the defect density in the amorphous silicon film 107 at least to a level more than the aforementioned density of the nickel element.

The defect density in the amorphous silicon film 107 can be estimated by measuring the spin density. In addition, to artificially form defects, the sputtering method, plasma CVD at low temperature may be used. Otherwise the plasma CVD or low pressure thermal CVD using only silane and disilane may be used without using hydrogen for neutralizing unpaired bonds.

When the defect density of the amorphous silicon film 107 is set to a high level, the removing capabilities of nickel element can be further enlarged. Then the effect shown in FIGS. 3 and 4 can be made large.

Embodiment 9

In this embodiment, a polycrystalline silicon film is used as a nickel element diffusion film for absorbing nickel element thereinto.

A process for fabricating a crystalline silicon film in accordance with this embodiment is described with reference to FIG. 1. First, a silicon oxide film 102 is formed as a base film to a thickness of 3000 Å on Corning 7059 glass substrate 101 (having a strain point 593° C.).

Next, an amorphous silicon film 103 is formed to a thickness of 600 Å by plasma CVD or low pressure thermal CVD. Nickel acetate solution adjusted to a prescribed nickel concentration is dripped on the amorphous silicon film 103 and is spin-coated by spinner 100 to form an aqueous film 104. In this way, nickel is provided in contact with a surface of the amorphous silicon film 103. (FIG. 1(A))

Next, the amorphous silicon film 103 is crystallized by heat treatment to obtain a crystalline silicon film 105. Temperature of the heat treatment is 550° C. and the duration of the heat treatment is 4 hours. (FIG. 1(B))

A silicon oxide film 106 is formed to a thickness of several tens Å to 100 Å on a surface of the obtained crystalline silicon film 105 by a UV light irradiation in air Next, a polycrystalline silicon film 107 is formed to a thickness of 600 Å by low pressure thermal CVD. It is not necessary to form the polycrystalline silicon film 107 with a film quality required for an active layer of a semiconductor. The actual film has a high defect density. It is preferred that this defect density is higher than defect density of the crystalline silicon film 105.

Next, nickel element contained in the crystalline silicon film 105 is diffused into the polycrystalline silicon film 107 through the oxide film 106 by heat treatment. (FIG. 1(C))

The lower limit of the heating temperature of this heat treatment is defined as a temperature at which nickel can diffuse and the lower limit is 400° C. or higher. The upper limit is defined as a strain point of the glass substrate 101. Nickel element contained in the crystalline silicon film 105 diffuses into the polycrystalline silicon film 107 by this heat treatment to enable the nickel element concentration in the crystalline silicon film 105 to decrease.

Generally, by forming the polycrystalline silicon film 107 to a thickness more than that of the crystalline silicon film 105, nickel concentration in the crystalline silicon film 105 can be lowered to half or less by the heat treatment.

Then, the amorphous silicon film 107 is removed by etching. Hydradine ($N_2H_6$) or $ClF_3$ gas can be used. Since the etching rate of the silicon oxide is extremely low and the silicon oxide film 106 serves as an etching stopper, only the polycrystalline silicon film 107 which has absorbed nickel can selectively be removed.

Next, the silicon oxide film 106 is removed by bufferred hydrofluoric acid and fluorine nitrate to obtain a crystalline silicon film 108 in a low nickel element concentration therein, as shown in FIG. 1(D).

Embodiment 10

An amorphous $Si_xGe_{1-x}$ film (0<x<1) is used as a nickel element diffusion film for absorbing nickel element therein in this embodiment.

A process for fabricating a crystalline silicon film according to this embodiment is described with reference to FIG. 1. First, a silicon oxide film 102 is formed as a base film to a thickness of 3000 Å on Corning 7059 glass substrate 101 having a strain point of 593° C.

Next, an amorphous silicon film 103 is formed to a thickness of 600 Å by plasma CVD or low pressure thermal CVD. A nickel acetate solution adjusted to a prescribed nickel concentration is dripped on the amorphous silicon film 103, and spin-coated by spinner 100 to form an aqueous film 104. In this way, nickel element is provided in contact with a surface of the amorphous silicon film. (FIG. 1(A))

Next, the amorphous silicon film 103 is crystallized by heat treatment to obtain a crystalline silicon film 105. The heating temperature is 550° C. and the heating duration is 4 hours. (FIG. 1(B))

A silicon oxide film 106 is formed to a thickness of several tens Å to 100 Å on a surface of the obtained crystalline silicon film 105 by a UV light irradiation in air.

Next, an amorphous $Si_xGe_{1-x}$ film 107 is formed to a thickness of 600 Å by plasma CVD using a silane ($SiH_4$) and germane($GeH_4$) as a raw material gas. In order to obtain the amorphous $Si_xGe_{1-x}$ film 107 at a high defect density, low temperature is used as the substrate temperature during the film formation and the raw material gas is used without being diluted with hydrogen.

Next, nickel element contained in the crystalline silicon film 105 is diffused into the amorphous $Si_xGe_{1-x}$ film 107 through the oxide film 106 by heat treatment. (FIG. 1(C))

The lower limit of the heating temperature of this heat treatment is defined as a temperature at which nickel can be diffused. The lower limit is 400° C. or higher. The upper limit is defined as a strain point of the glass substrate 101. The nickel element contained in the crystalline silicon film 105 is diffused into the amorphous $Si_xGe_{1-x}$ film 107 to lower nickel element concentration in the crystalline silicon film 105.

The $Si_xGe_{1-x}$ film 107 is removed by etching. In order to use the silicon oxide film 106 as an etching stopper, an etching solution or etching gas having a high etching selectivity between the $Si_xGe_{1-x}$ film 107 and the silicon oxide film 106 is used. In this way, only the $Si_xGe_{1-x}$ film 107 which has absorbed nickel can be selectively removed.

Next, the silicon oxide film 106 is removed by bufferred hydrofluoric acid or fluorine nitrate to obtain a crystalline silicon film 108 with a low nickel element concentration, as shown in FIG. 1(D).

As described above, in accordance with the present invention, by the function of the metal element, the crystalline silicon film can be fabricated at a low temperature such as about 550° C. or less which is lower than the prior art. Consequently, the crystalline silicon film using a glass substrate can be obtained.

Further, a crystalline silicon film having a low density of metal element can be obtained by dispersing the metal element into the amorphous silicon film from the crystalline silicon film crystallized with the action of the metal element. Consequently, a device free from the bad influence of the metal element, for example, a thin film transistor can be obtained by using a crystalline silicon film.

Further, the crystalline silicon film free from the deviation of the metal element can be obtained by dispelling to a second silicon film a portion where the metal element in the silicon film crystallized by the action of the metal element is deviated. In this manner, a device free from the bad influence of the metal element can be obtained.

What is claimed is:

1. A method for fabricating a semiconductor thin film comprising the steps of:

providing an amorphous semiconductor film with a metal element which promotes crystallization of said semiconductor film;

crystallizing said amorphous semiconductor film by heat treatment to obtain a crystalline semiconductor film;

forming a metal element diffusion film comprising a semiconductor in contact with said crystalline semiconductor film;

diffusing said metal element into said metal element diffusion film; and removing said metal element diffusion film into which said metal element has been diffused.

2. The method of claim 1 wherein said metal element diffusion film is an amorphous silicon film.

3. The method of claim 1 wherein said metal element diffusion film is a polycrystalline silicon film.

4. The method of claim 1 wherein said metal element diffusion film is an amorphous $Si_xGe_{1-x}$ film where $0<x<1$.

5. The method of claim 1 wherein one or a plurality of elements selected from the group consisting of Fe, Co, Ni, Ru, Rh, Pd, Os, Ir, Pt, Cu, and Au are used as said metal element.

6. A method for fabricating a semiconductor thin film comprising the steps of:

providing an amorphous semiconductor film with a metal element which promotes crystallization of said semiconductor film;

crystallizing said amorphous semiconductor film by heat treatment to obtain a crystalline semiconductor film;

forming an oxide film in contact with said crystalline semiconductor film;

forming a metal element diffusion film comprising a semiconductor in contact with said oxide film;

diffusing said metal element into said metal element diffusion film; and removing said metal element diffusion film into which said metal element has been diffused, using said oxide film as an etching stopper.

7. The method of claim 6 wherein said metal element diffusion film is an amorphous silicon film.

8. The method of claim 6 wherein said metal element diffusion film is a polycrystalline silicon film.

9. The method of claim 6 wherein said metal element diffusion film is an amorphous $Si_xGe_{1-x}$ film where $0<x<1$.

10. The method of claim 6 wherein one or a plurality of elements selected from the group consisting of Fe, Co, Ni, Ru, Rh, Pd, Os, Ir, Pt, Cu, and Au are used as said metal element.

11. A method for fabricating a semiconductor thin film comprising the steps of:

providing an amorphous semiconductor film with a metal element which promotes crystallization of said semiconductor film;

obtaining a crystalline semiconductor film by crystallizing said amorphous semiconductor film by heat treatment;

forming an amorphous semiconductor film in contact with said crystalline semiconductor film;

heat treating said amorphous semiconductor film formed in contact with said crystalline semiconductor film; and removing the semiconductor film formed in contact with said crystalline semiconductor film.

12. The method of claim 11 wherein at least one kind of elements selected from Fe, Co, Ni, Ru, Rh, Pd, Os, Ir, Pt, Cu and Au is used as the metal element promoting the crystallization.

13. The method of claim 11 wherein the thickness of the amorphous silicon film formed on the crystalline silicon film is thicker than the thickness of said crystalline silicon film.

14. A method for fabricating a semiconductor thin film comprising the steps of:

providing an amorphous silicon film with a metal element which promotes crystallization of said silicon film;

obtaining a crystalline silicon film by crystallizing said amorphous silicon film by heat treatment;

forming an oxide film in contact with said crystalline silicon film;

forming an amorphous semiconductor film in contact with said oxide film;

dispersing by heat treatment the metal element in said crystalline silicon film into the amorphous semiconductor film formed in contact with said oxide film; and removing the silicon film formed on said oxide film by using said oxide film as an etching stopper.

15. The method of claim 14 wherein at least one kind of elements selected from Fe, Co, Ni, Ru, Rh, Pd, Os, Ir, Pt, Cu and Au is used as the metal element promoting the crystallization.

16. The method of claim 14 wherein the thickness of the amorphous silicon film formed on the crystalline silicon film is thicker than the thickness of said crystalline silicon film.

17. A method for fabricating a semiconductor thin film comprising the steps of:

providing an amorphous silicon film with a metal element which promotes crystallization of said silicon film;

obtaining a crystalline silicon film by crystallizing said amorphous silicon film by heat treatment;

forming an amorphous semiconductor film in contact with said crystalline silicon film;

dispersing by heat treatment the metal element in said crystalline silicon film into the amorphous semiconductor film formed in contact with said crystalline silicon film;

removing the semiconductor film formed in contact with said crystalline silicon film; and heating and/or irradiating said crystalline silicon film with laser light.

18. The method of claim 17 wherein at least one kind of elements selected from Fe, Co, Ni, Ru, Rh, Pd, Os, Ir, Pt, Cu and Au is used as the metal element promoting the crystallization.

19. The method of claim 17 wherein the thickness of the amorphous silicon film formed on the crystalline silicon film is thicker than the thickness of said crystalline silicon film.

20. A method for fabricating a semiconductor thin film comprising the steps of:

providing an amorphous silicon film with a metal element which promotes crystallization of said silicon film;

obtaining a crystalline silicon film by crystallizing said amorphous silicon film by heat treatment;

forming an amorphous semiconductor film in contact with said crystalline silicon film;

heat treating the amorphous semiconductor film at a temperature at which the amorphous semiconductor film is not crystallized; and removing the amorphous semiconductor film formed in contact with said crystalline silicon film.

21. The method of claim 20 wherein at least one kind of elements selected from Fe, Co, Ni, Ru, Rh, Pd, Os, Ir, Pt, Cu and Au is used as the metal element promoting the crystallization.

22. The method of claim 20 wherein the thickness of the amorphous silicon film formed on the crystalline silicon film is thicker than the thickness of said crystalline silicon film.

23. A method for fabricating a semiconductor thin film comprising the steps of:

provided an amorphous silicon film with a metal element which promotes crystallization of said silicon film;

obtaining a crystalline silicon film by crystallizing said amorphous silicon film by heat treatment;

forming an amorphous semiconductor film in contact with said crystalline silicon film;

crystallizing by heat treatment the amorphous semiconductor film formed in contact with said crystalline silicon film; and removing the semiconductor film formed in contact with said crystalline silicon film.

24. The method of claim 23 wherein at least one kind of elements selected from Fe, Co, Ni, Ru, Rh, Pd, Os, Ir, Pt, Cu and Au is used as the metal element promoting the crystallization.

25. The method of claim 23 wherein the thickness of the amorphous silicon film formed on the crystalline silicon film is thicker than the thickness of said crystalline silicon film.

26. A method for fabricating a semiconductor thin film comprising the steps of:

providing an amorphous silicon film with a metal element which promotes crystallization of said silicon film;

obtaining a crystalline silicon film by crystallizing said amorphous silicon film by heat treatment;

forming an oxide film in contact with said crystalline silicon film;

forming an amorphous semiconductor film in contact with said oxide film;

crystallizing by heat treatment the amorphous semiconductor film which is formed in contact with said oxide film; and removing the semiconductor film which is formed in contact with said oxide film by using said oxide film as an etching stopper.

27. The method of claim 26 wherein at least one kind of elements selected from Fe, Co, Ni, Ru, Rh, Pd, Os, Ir, Pt, Cu and Au is used as the metal element promoting the crystallization.

28. The method of claim 26 wherein the thickness of the amorphous silicon film formed on the crystalline silicon film is thicker than the thickness of said crystalline silicon film.

29. A method for fabricating a semiconductor thin film comprising the steps of:

providing an amorphous silicon film with a concentration of a metal element which promotes crystallization of said silicon film;

obtaining a crystalline silicon film by crystallizing said amorphous silicon film by heat treatment;

forming an amorphous semiconductor film in contact with said crystalline silicon film; and reducing by heat treatment said concentration of the metal element by a half or more in said crystalline silicon film.

30. The method of claim 29 wherein at least one kind of elements selected from Fe, Co, Ni, Ru, Rh, Pd, Os, Ir, Pt, Cu and Au is used as the metal element promoting the crystallization.

31. The method of claim 29 wherein the thickness of the amorphous silicon film formed on the crystalline silicon film is thicker than the thickness of said crystalline silicon film.

32. A method for fabricating a semiconductor thin film comprising the steps of:

providing an amorphous silicon film with a metal element which promotes crystallization of said silicon film;

obtaining a crystalline silicon film by crystallizing said amorphous silicon film by heat treatment;

forming an amorphous semiconductor film in contact with said crystalline silicon film; and heat treating the amorphous semiconductor film formed in contact with said crystalline silicon film;

wherein the average defect density in said amorphous semiconductor film formed in contact with said crystalline silicon film is set to a value larger than the minimum value of a density of said metal element in said crystalline silicon film.

33. The method of claim 32 wherein at least one kind of elements selected from Fe, Co, Ni, Ru, Rh, Pd, Os, Ir, Pt, Cu and Au is used as the metal element promoting the crystallization.

34. The method of claim 32 wherein the thickness of the amorphous silicon film formed on the crystalline silicon film is thicker than the thickness of said crystalline silicon film.

35. A method for fabricating a semiconductor thin film comprising the steps of:

providing an amorphous silicon film with a metal element which promotes crystallization of said silicon film;

crystallizing said amorphous silicon film by heat treatment to obtain a crystalline silicon film;

forming a $Si_xGe_{1-x}$ film in contact with said crystalline silicon film where $0<x<1$; and diffusing said metal element into said $Si_xGe_{1-x}$ film.

36. A method for fabricating a semiconductor thin film comprising the steps of:

forming an amorphous semiconductor film on a glass substrate;

providing said amorphous semiconductor film with a metal element which promotes crystallization of said semiconductor film;

crystallizing said amorphous semiconductor film by said metal element to obtain a crystalline semiconductor film;

forming a metal element diffusion film comprising a semiconductor in contact with said crystalline semiconductor film; and diffusing said metal element into said metal element diffusion film by heat treatment at a temperature of 400° C. to a strain point of said glass substrate.

37. A method for fabricating a semiconductor thin film comprising the steps of:

forming an amorphous semiconductor film on a glass substrate;

providing said amorphous semiconductor film with a metal element which promotes crystallization of said semiconductor film;

crystallizing said amorphous semiconductor film by said metal element to obtain a crystalline semiconductor film;

forming a metal element diffusion film comprising a semiconductor in contact with said crystalline semiconductor film, said metal element diffusion film comprising an amorphous or polycrystalline semiconductor; and diffusing said metal element from said crystalline semiconductor film into said metal element diffusion film by heat treatment at a temperature of 400° C. or higher, wherein said crystalline semiconductor film constitutes an active layer.

38. A method for fabricating a semiconductor thin film comprising the steps of:
   providing an amorphous semiconductor film with a metal element which promotes crystallization of said semiconductor film;
   crystallizing said amorphous semiconductor film by heat treatment to obtain a crystalline semiconductor film;
   forming a silicon oxide film in contact with said semiconductor film;
   forming a metal element diffusion film comprising a semiconductor in contact with said silicon oxide film;
   diffusing said metal element into said metal element diffusion film; and
   removing said metal element diffusion film into which said metal element has been diffused.

39. The method of claim 1 wherein said crystalline semiconductor film comprises a crystal grown in a longitudinal direction.

40. The method of claim 1 wherein said crystalline semiconductor film comprises an active layer of a thin film transistor.

41. The method of claim 1 wherein said metal element diffusion film comprises an amorphous $Si_xGe_{1-x}$ where $0<x<1$.

42. The method of claim 6 wherein said crystalline semiconductor film comprises a crystal grown in a longitudinal direction.

43. The method of claim 6 wherein said crystalline semiconductor film comprises an active layer of a thin film transistor.

44. The method of claim 6 wherein said metal element diffusion film comprises an amorphous $Si_xGe_{1-x}$ where $0<x<1$.

45. The method of claim 11 wherein said crystalline semiconductor film comprises a crystal grown in a longitudinal direction.

46. The method of claim 11 wherein said crystalline semiconductor film comprises an active layer of a thin film transistor.

47. The method of claim 35 wherein said crystalline silicon film comprises a crystal grown in a longitudinal direction.

48. The method of claim 35 wherein said crystalline silicon film comprises an active layer of a thin film transistor.

49. The method of claim 36 wherein said crystalline semiconductor film comprises a crystal grown in a longitudinal direction.

50. The method of claim 36 wherein said crystalline semiconductor film comprises an active layer of a thin film transistor.

51. The method of claim 36 wherein said metal element diffusion film comprises an amorphous $Si_xGe_{1-x}$ where $0<x<1$.

52. The method of claim 37 wherein said crystalline semiconductor film comprises a crystal grown in a longitudinal direction.

53. The method of claim 37 wherein said crystalline semiconductor film comprises an active layer of a thin film transistor.

54. The method of claim 37 wherein said metal element diffusion film comprises an amorphous $Si_xGe_{1-x}$ where $0<x<1$.

55. The method of claim 38 wherein said crystalline semiconductor film comprises a crystal grown in a longitudinal direction.

56. The method of claim 38 wherein said crystalline semiconductor film comprises an active layer of a thin film transistor.

57. The method of claim 38 wherein said metal element diffusion film comprises an amorphous $Si_xGe_{1-x}$ where $0<x<1$.

58. The method of claim 11 wherein said amorphous semiconductor film comprises silicon.

59. The method of claim 14 wherein said amorphous semiconductor film comprises silicon.

60. The method of claim 17 wherein said amorphous semiconductor film comprises silicon.

61. The method of claim 20 wherein said amorphous semiconductor film comprises silicon.

62. The method of claim 26 wherein said amorphous semiconductor film comprises silicon.

63. The method of claim 29 wherein said amorphous semiconductor film comprises silicon.

64. The method of claim 32 wherein said amorphous semiconductor film comprises silicon.

* * * * *